(12) United States Patent
Tanemura

(10) Patent No.: US 6,956,297 B2
(45) Date of Patent: Oct. 18, 2005

(54) ELECTRONIC CIRCUIT UNIT THAT IS EASY TO MANUFACTURE AND METHOD OF MANUFACTURING THE SAME

(75) Inventor: Takeshi Tanemura, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/796,632

(22) Filed: Mar. 9, 2004

(65) Prior Publication Data

US 2004/0178487 A1    Sep. 16, 2004

(30) Foreign Application Priority Data

Mar. 13, 2003  (JP) .............................. 2003-068645

(51) Int. Cl.[7] .............................................. H01L 23/29
(52) U.S. Cl. ..................... 257/790; 257/787; 257/788; 257/793; 257/723; 257/724
(58) Field of Search ............... 257/790, 793, 257/787, 788, 723, 724

(56) References Cited

U.S. PATENT DOCUMENTS

| | | | | |
|---|---|---|---|---|
| 5,140,384 A | * | 8/1992 | Tanaka ......................... | 257/36 |
| 5,600,181 A | * | 2/1997 | Scott et al. .................. | 257/723 |
| 5,801,438 A | | 9/1998 | Shirakawa et al. | |
| 5,952,713 A | * | 9/1999 | Takahira et al. ............. | 257/679 |
| 5,973,263 A | * | 10/1999 | Tuttle et al. ................ | 174/52.2 |
| 6,663,953 B2 | * | 12/2003 | Kamiya et al. .............. | 428/327 |
| 2004/0245528 A1 | * | 12/2004 | Hiramoto ..................... | 257/79 |

FOREIGN PATENT DOCUMENTS

| | | | | |
|---|---|---|---|---|
| JP | 63-46754 | * | 2/1988 | .................. 257/790 |
| JP | 6-45477 | * | 2/1994 | .................. 257/787 |
| JP | 9-121006 | | 5/1997 | |

* cited by examiner

*Primary Examiner*—Jasmine Clark
(74) *Attorney, Agent, or Firm*—Brinks Hofer Gilson & Lione

(57) ABSTRACT

An electronic circuit unit includes a substrate on which a wiring pattern is provided; electronic parts, including a semiconductor bare chip disposed on a surface of the substrate; and a soft sealing resin provided on the substrate so as to cover the electronic parts. A wire of the semiconductor bare chip is connected to the wiring pattern and is covered with the soft sealing resin and a protection member made of a resin harder than the sealing resin having an upper wall having a flat external surface and leg parts extending from the upper wall to the substrate. Since the leg parts are secured to the substrate while the protection member covers the sealing resin, the protection member can protect the sealing resin without being cracked even when external force is applied to the protection member, thereby preventing the wire from breaking.

3 Claims, 3 Drawing Sheets

ELECTRONIC CIRCUIT UNIT THAT IS EASY TO MANUFACTURE AND METHOD OF MANUFACTURING THE SAME

This application claims the benefit of priority to Japanese Patent Application No. 2003-068645, herein incorporated by reference.

BACKGROUND OF THE INVENTION

1. Field of the Invention

The present invention relates to an electronic circuit unit suitable for use in a voltage controlled oscillator and a method of manufacturing the same.

2. Description of the Related Art

Regarding the drawings of the conventional semiconductor device, FIG. 6 is a cross-sectional view of a conventional semiconductor device, and FIG. 7 is a cross-sectional view of a conventional semiconductor device to which external force is applied.

Hereinafter, a configuration of the conventional semiconductor device will be described with reference to FIGS. 6 and 7. A semiconductor bare chip 52 is bonded onto a substrate 51 made of ceramics or the like, and a wire 53 of the semiconductor bare chip 52 is connected to a terminal (not shown) provided on the substrate 51.

A sealing resin 54 made of a soft resin material is coated on the substrate 51 so as to cover the semiconductor bare chip 52 and the wire 53. By coating with the sealing resin 54, moisture resistance of the semiconductor bare chip 52 is secured. At the same time, since the linear expansion coefficient of the sealing resin 54 is greater than that of the wire 53, it is possible to reduce stress of the semiconductor bare chip 52 or the wire 53 and to prevent the wire 53 from breaking by using the soft sealing resin 54.

An overcoat film 55 made of a material harder than that of the sealing resin 54 is formed on a portion of the outer surface of the sealing resin 54 so that when external force is applied to the overcoat film 55, cracks are easily generated on the overcoat film 55 (for example, see Patent Document 1).

The overcoat film 55 made of the material harder than that of the sealing resin 54 is provided on the sealing resin 54, but is cracked when external force is applied in the direction of the arrow A, as shown in FIG. 7. As a result, breaking of the wire 53 is easily detected.

Therefore, the overcoat film 55 not only fails to protect the wire 53 and causes breaking of the wire 53 when external force is applied, but also, even if the semiconductor device is mounted on a predetermined place by a mounting machine, the overcoat film 55 cracks when adsorption is applied to it by an adsorption unit of the mounting machine. As a result, it is impossible to mount the semiconductor device using the mounting machine.

Patent Document 1

Japanese Unexamined Patent Application Publication No. 9-121006

The conventional semiconductor device has a problem that the overcoat film 55 made of the material harder than that of the sealing resin 54 is provided on the sealing resin 54, but is easily cracked, whereby breaking of the wire 53 is easily detected, and thus it fails to protect the wire 53, as a result of which the wire 53 breaks when external force is applied. Also, the conventional semiconductor device has another problem that the overcoat film 55 cracks, as a result, when the semiconductor device is mounted by the mounting machine, it is impossible to mount the semiconductor using the mounting machine.

SUMMARY OF THE INVENTION

Therefore, it is an object of the present invention to provide an electronic circuit unit in which the wire of a semiconductor bare chip does not break, and which electronic circuit unit can be mounted by a mounting machine, can be simply manufactured, and can be obtained at a low cost, and a method of manufacturing the electronic circuit unit.

To achieve this object, in a first aspect of the present invention, there is provided an electronic circuit unit that comprises a substrate on which a wiring pattern is provided; electronic parts, including a semiconductor bare chip disposed on the surface of the substrate; a soft sealing resin provided on the surface of the substrate so as to cover the electronic parts, wherein a wire of the semiconductor bare chip is connected to the wiring pattern and is covered with the soft sealing resin; and a protection member made of a resin harder than the soft sealing resin, having an upper wall which is a flat outer surface and leg parts extending from the upper wall to the substrate, wherein the protection member is provided with the leg parts which are secured to the substrate while covering the sealing resin.

In addition, in a second aspect of the present invention, the protection member covers the entire exposed surface of the substrate and the entire outer surface of the soft sealing resin.

Further, in a third aspect of the present invention, the substrate comprises an inductor formed of a thin film, a resistor formed of a thin film, and/or a capacitor formed of a thin film thereon.

Furthermore, in a fourth aspect of the present invention, there is provided a method of manufacturing an electronic circuit unit, comprising the steps of: preparing a substrate on which electronic parts including a semiconductor bare chip are provided and a sealing resin composed of a soft resin material covering the electronic parts is provided; and forming a protection member by filling or coating a resin that becomes harder than the sealing resin when solidifying, on the surface of the substrate and the outer surface of the sealing resin so as to cover the surface of the substrate and the outer surface of the sealing resin, wherein the protection member is provided with an upper wall having a flat outer surface and leg parts extending from the upper wall and secured to the substrate.

In addition, in a fifth aspect of the present invention, there is further provided a large plate substrate that is formed by bonding a plurality of the substrates on which the sealing resin is formed, wherein the resin that becomes harder than the sealing resin is filled or coated on the surface of the large plate substrate and the sealing resin, and the large plate substrate and the resin are cut after the resin is solidified, thereby forming a single substrate having the protection member.

In addition, in a sixth-aspect of the present invention, there is further provided a jig exposing the surface of the large plate substrate and holding the resin that becomes hard therein, wherein the resin that becomes hard is filled or coated on an inner side of the jig, and the resin is provided on large plate substrate, thereby solidifying the resin that becomes hard.

DESCRIPTION OF THE PREFERRED EMBODIMENTS

Figure 1:
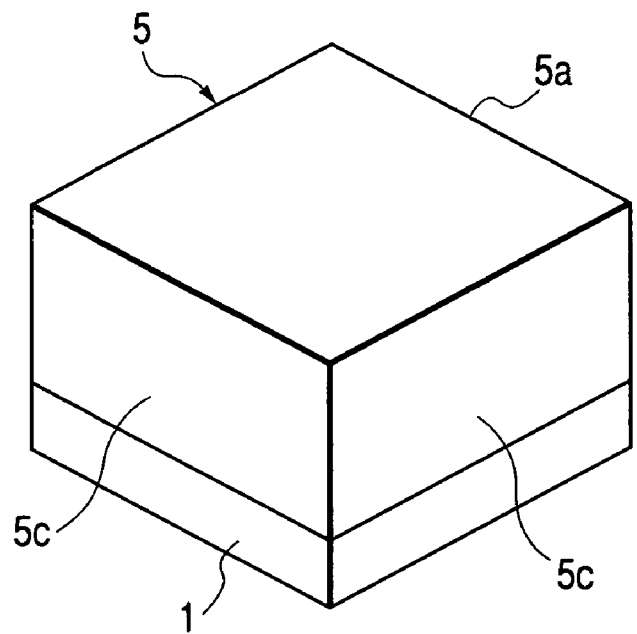
FIG. 1 is a perspective view of an electronic circuit unit according to the present invention.
Figure 2:
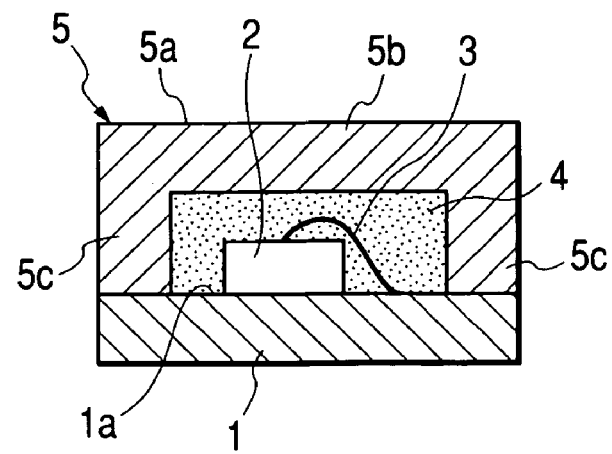
FIG. 2 is a cross-sectional view of the main elements of the electronic circuit unit of FIG. 1.
Figure 3:
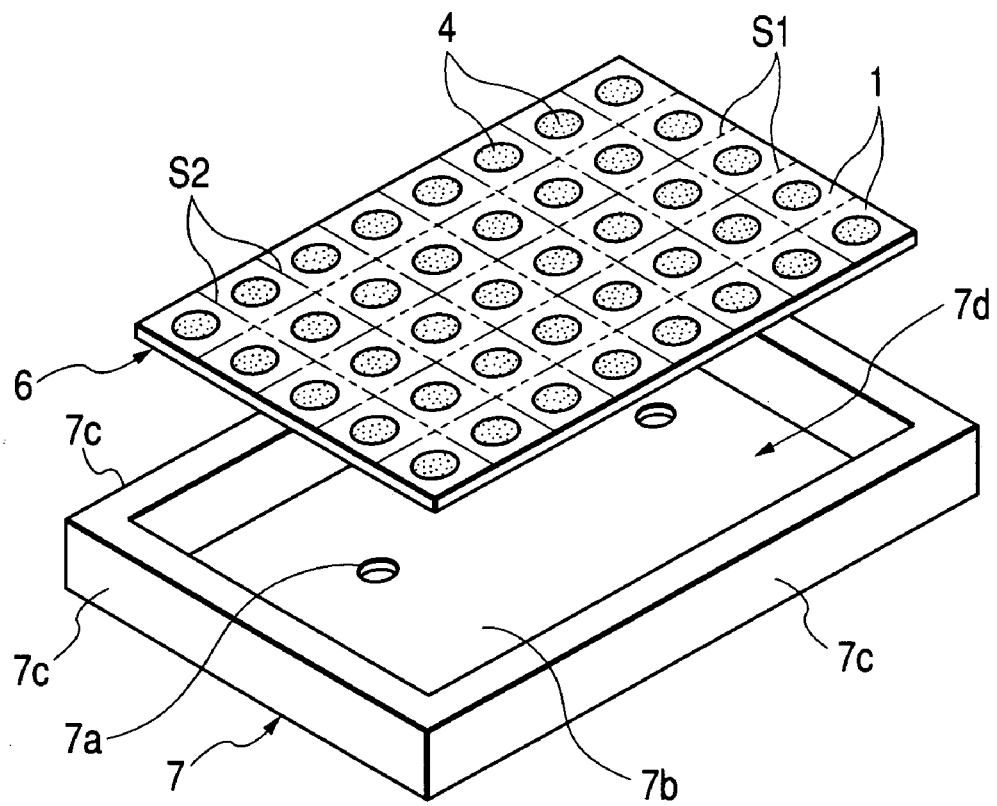
FIG. 3 is an exploded perspective view for explaining a method of manufacturing the electronic circuit unit according to the present invention.
Figure 4:
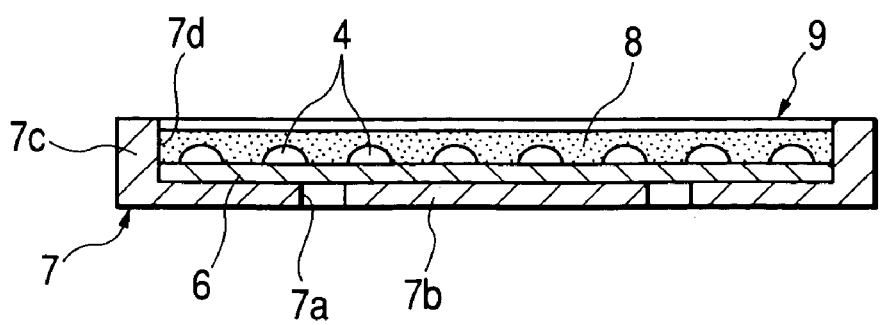
FIG. 4 is a cross-sectional view of the main elements for explaining the method of manufacturing the electronic circuit unit according to the present invention.
Figure 5:
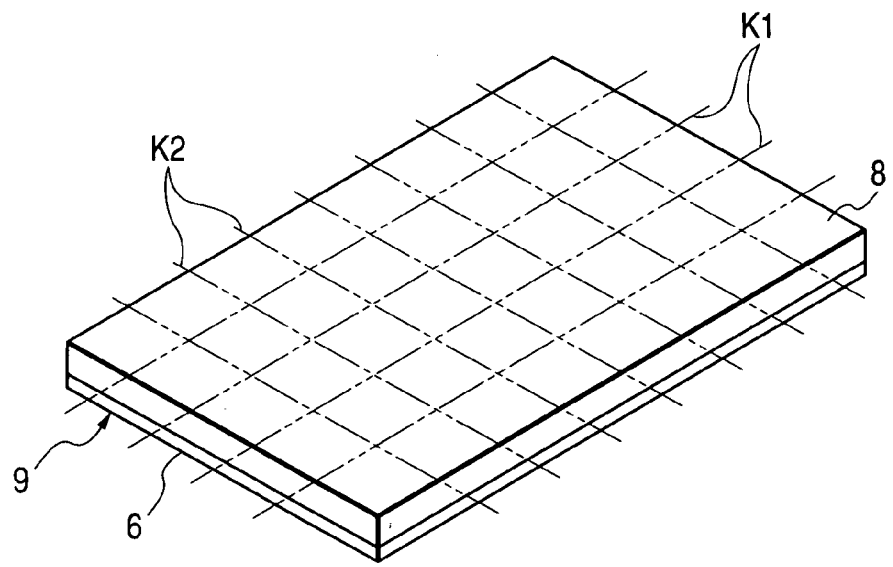
FIG. 5 is a perspective view of an assembly manufactured by the method of manufacturing the electronic circuit unit according to the present invention.
Figure 6:
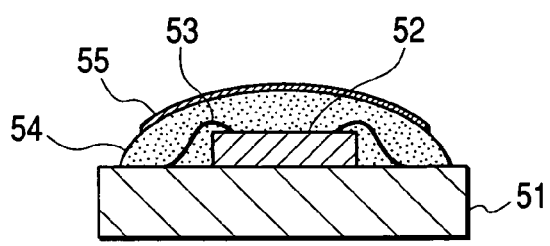
FIG. 6 is a cross-sectional view of a conventional semiconductor device.
Figure 7:
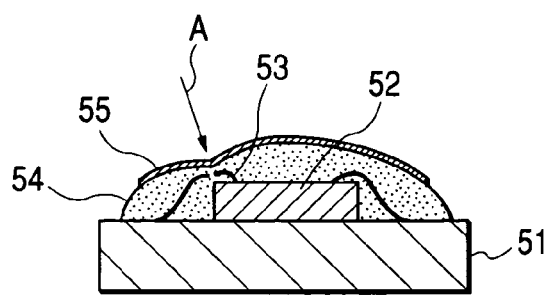
FIG. 7 is a cross-sectional view of the conventional semiconductor device to which external force is applied.

The present invention will now be described with reference to the drawings. FIG. 1 is a perspective view of an electronic circuit unit according to the present invention, FIG. 2 is a cross-sectional view of the main elements of the electronic circuit unit of FIG. 1, FIG. 3 is an exploded perspective view for explaining a method of manufacturing the electronic circuit unit according to the present invention, FIG. 4 is a cross-sectional view of the main elements for explaining the method of manufacturing the electronic circuit unit of FIG. 1 according to the present invention, and FIG. 5 is a perspective view of an assembly manufactured by the method of manufacturing the electronic circuit unit according to the present invention.

Hereinafter, the configuration of the electronic circuit unit according to the present invention will be described with reference to FIGS. 1 and 2. A wiring pattern (not shown) is formed by a thin film (not shown) on a surface 1a of a substrate 1 made of alumina, ceramics or the like. Also, electronic parts such as an inductor, a resistor, and a capacitor, are formed by thin films.

A semiconductor bare chip 2 having a wire 3 is bonded onto the surface 1a of the substrate 1, and is connected to the wire 3 of the semiconductor bare chip 2 or the wiring pattern (not shown), thereby forming a desired electric circuit on the substrate 1.

A coating of a sealing resin 4 made of a soft resin material is provided on the surface 1a of the substrate 1 so as to cover the semiconductor bare chip 2, the wire 3, the inductor, the resistor, and the capacitor. By coating with the sealing resin 4, it is possible to secure moisture resistance of the electronic parts including the semiconductor bare chip 2, on the substrate 1. Also, since the linear expansion coefficient of the sealing resin 4 is greater than that of the wire 3, it is possible to reduce stress of the semiconductor bare chip 2 or the wire 3 and to prevent the wire 3 from breaking by using soft sealing resin 4.

A protection member 5 made of a material harder than that of the sealing resin 4 has an upper wall 5b and leg parts 5c. The upper wall 5b has a flat external surface 5a, and the leg parts 5c extend from the upper wall 5b to the substrate 1. The protection member 5 is formed such that the upper wall 5b and the leg parts 5c cover all of the exposed surface 1a of the substrate 1 and the outer surface of the sealing resin 4, and thus, the leg parts 5c are secured to the substrate 1.

In the electronic circuit unit having the above configuration, since an entire outer periphery of the sealing resin 4 composed of a soft resin is covered by the hard protection member 5, the protection member 5 protects the sealing resin 4 without being cracked even when external force is applied to the protection member 5. As a result, it is possible to prevent the wire 3 from breaking.

Also, the outer surface 5a of the protection member 5 is flat and is parallel to the surface 1a of the substrate 1. An adsorption unit (not shown) of a mounting machine (not shown) is applied to the outer surface 5a and mounts the electronic circuit unit on a predetermined place while applying adsorption to the electronic circuit unit.

Next, a method of manufacturing the electronic circuit unit of FIG. 1 according to the present invention will be described with reference to FIGS. 3 to 5. As shown in FIG. 3, a plurality of substrates 1, each of which forms a single electronic circuit unit, is connected to form a large plate substrate 6, and the electronic parts and the sealing resin 4 covering the electronic parts are installed correspondingly to each of the substrates 1. In other words, as shown in FIG. 3, a single electronic circuit unit is formed in an area surrounded by two-dot chain lines S1 and S2.

A jig 7 for forming the protection member 5 comprises a bottom wall 7b, four sidewalls 7c, and a storage unit 7d. The bottom wall 7b has a hole 7a, the four sidewalls 7c are disposed to surround the four sides of the bottom wall 7b, and the storage unit 7d is surrounded by the bottom wall 7b and the sidewall 7c to hold a resin.

Also, while there has been described with reference to the above embodiment that the bottom wall 7b and the sidewall 7c are integrally formed as a single element, the four sidewalls 7c may be separated from the bottom wall 7b, and the jig 7 may be formed of combination of the four sidewalls 7c and the bottom wall 7b. Alternatively, the four sidewalls 7c may be separated from one another and one sidewall may be formed of a combination of separate sidewalls 7c.

As shown in FIG. 4, after the large plate substrate 6 is received within the jig 7, a resin 8 is filled into or coated on the storage unit 7d of the jig 7. Here, the resin 8 becomes harder than the sealing resin 4 when solidified. The resin 8 covers the exposed surface of the large plate substrate 6 and the entire outer surface of the sealing resin 4. The surface of the resin 8 is flat due to flowability of the resin 8 and is parallel to the surface of the large plate substrate 6. At this time, if the resin 8 is hardened, an assembly 9 is configured such that a plurality of electronic circuit units are integrally formed, as shown in FIG. 5.

Thereafter, the assembly 9 is pulled out from the jig 7 through the hole 7a or pulled out from the jig 7 by separating the sidewall 7c from the bottom wall 7b. Then the assembly 9 is formed as shown in FIG. 5.

As shown in FIG. 5, first, the assembly 9 is cut to form a strip shape, for example, the resin 8 and the large plate substrate 6 of the assembly 9 are cut along cutting lines K1 using a cutting jig (not shown), and then the resin 8 and the large plate substrate 6 are cut along cutting lines K2. Therefore, manufacturing of the electronic circuit unit is completed. Thus, as shown in FIG. 1, a single electronic circuit unit formed the protection member 5 thereon is manufactured.

Also, while there has been described with reference to the above embodiment, the large plate substrate 6 is used to manufacture the electronic circuit unit, the electronic circuit unit may be manufactured using a single substrate 1.

The electronic circuit unit according to the present invention comprises the substrate that provides the wiring pattern;

the electronic parts, including the semiconductor bare chip disposed on the surface of the substrate; and the sealing resin provided on the surface of the substrate so as to cover the electronic parts. The wire of the semiconductor bare chip is connected to the wiring pattern and is coated by the soft sealing resin. The protection member made of the resin harder than the sealing resin has an upper wall having a flat outer surface and leg parts extending from the upper wall to the substrate. The leg parts are secured to the substrate while the protection member covers the sealing resin.

In this way, if the sealing resin made of a soft resin is covered with the hard protection member, the protection member can protect the sealing resin without being cracked even when external force is applied, thereby preventing the wire from cutting.

Also, since the outer surface of the protection member is flat, the electronic circuit unit can be adsorbed by applying the adsorption unit of the mounting machine to the outer surface of the protection member. Therefore, it is possible to mount the electronic circuit unit by using the mounting machine.

Since the entire exposed surface of the substrate and the entire outer surface of the sealing resin are covered by the protection member, moisture resistance is improved, manufacturing of the electronic circuit unit is facilitated, and the electronic circuit unit can be obtained at a low price.

Also, the inductor formed of a thin film, the resistor formed of a thin film, and/or the capacitor formed of a thin film are provided on the substrate. As a result, it is possible to reduce the size of the circuit and to prevent the breaking of the wire.

Since the electronic parts including the semiconductor bare chip and the sealing resin made of a soft resin that covers the electronic parts, are provided on the substrate, and the protection member made of a material that is harder than that of the sealing resin when it is solidified has an upper wall having a flat outer surface and leg parts extending from the upper wall to the substrate is formed such that the upper wall and the leg parts cover the exposed surface of the substrate and the entire outer surface of the sealing resin and the leg parts are secured to the substrate, it is possible to obtain high productivity and a low-cost electronic circuit unit in which the protection member can be easily formed.

Also, a large plate substrate formed by bonding the plurality of substrates on which the sealing resin is formed is provided, a resin that becomes harder than the sealing resin when hardened is filled into or coated onto the surface of the large plate substrate and the surface of the sealing resin from above the substrate and the sealing resin, the large plate substrate and the resin are cut after the resin is hardened, and thus a single pattern having the protection member is formed. Since a plurality of protection members can be manufactured at one time, it is possible to obtain a low-priced electronic circuit unit that can be easily manufactured.

Also, the present invention comprises a jig exposing the surface of the large plate substrate and holding a resin that becomes hardened therein, and, since the resin is filled or coated therein and the large plate substrate is provided with the resin and the resin is hardened, it is possible to obtain an electronic circuit unit in which the protection member can be easily manufactured and in which a resin having a flat surface can be obtained.

What is claimed is:

1. An electronic circuit unit comprising:
    a substrate on which a wiring pattern is provided;
    electronic parts, including a semiconductor bare chip disposed on a surface of the substrate;
    a soft sealing resin provided on the surface of the substrate so as to cover the electronic parts, wherein a wire of the semiconductor bare chip is connected to the wiring pattern and is covered with the soft sealing resin; and
    a protection member made of a resin harder than the soft sealing resin having an upper wall which is a flat outer surface and leg parts extending from the upper wall to the substrate,
    wherein the leg parts secured to the substrate while covering the sealing resin and the substrate comprises at least one of an inductor formed of a thin film, a resistor formed of a thin film, or a capacitor formed of a thin film thereon.

2. The electronic circuit unit according to claim 1, wherein the protection member covers the entire exposed surface of the substrate and the entire outer surface of the soft sealing resin.

3. A method of manufacturing an electronic circuit unit, the method comprising:
    preparing a substrate on which electronic parts including a semiconductor bare chip are provided and a sealing resin composed of a soft resin material covering the electronic parts is provided;
    forming a protection member by filling or coating a resin that becomes harder than the sealing resin when solidifying, on a surface of the substrate and an outer surface of the sealing resin so as to cover the surface of the substrate and the outer surface of the sealing resin; and
    providing a large plate substrate that is formed by bonding a plurality of the substrates on which the sealing resin is formed,
    wherein the protection member is provided with an upper wall having a flat outer surface and leg parts extending from the upper wall and secured to the substrate and the resin that becomes harder than the sealing resin is filled or coated on the surface of the large plate substrate and the sealing resin, and the large plate substrate and the resin are cut after the resin is solidified, thereby forming a single substrate having the protection member.

* * * * *